United States Patent
Lin et al.

(10) Patent No.: US 9,704,880 B2
(45) Date of Patent: Jul. 11, 2017

(54) SYSTEMS AND METHODS FOR A SEMICONDUCTOR STRUCTURE HAVING MULTIPLE SEMICONDUCTOR-DEVICE LAYERS

(71) Applicant: Taiwan Semiconductor Manufacturing Company Limited, Hsinchu (TW)

(72) Inventors: Yi-Tang Lin, Hsinchu (TW); Chun-Hsiung Tsai, Hsinchu County (TW); Clement Hsingjen Wann, New York, NY (US)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/073,236

(22) Filed: Nov. 6, 2013

(65) Prior Publication Data

US 2015/0123203 A1     May 7, 2015

(51) Int. Cl.
*H01L 27/12* (2006.01)
*H01L 21/84* (2006.01)

(52) U.S. Cl.
CPC .......... *H01L 27/1203* (2013.01); *H01L 21/84* (2013.01); *H01L 21/845* (2013.01); *H01L 27/1211* (2013.01)

(58) Field of Classification Search
CPC . H01L 27/1203; H01L 21/84; H01L 27/1211; H01L 21/845
See application file for complete search history.

(56) References Cited

U.S. PATENT DOCUMENTS

| | | | | |
|---|---|---|---|---|
| 5,324,687 A * | 6/1994 | Wojnarowski | ................ | 438/107 |
| 6,355,501 B1 * | 3/2002 | Fung et al. | ................... | 438/107 |
| 6,392,253 B1 * | 5/2002 | Saxena | ........................... | 257/59 |
| 7,253,091 B2 * | 8/2007 | Brewer et al. | ................ | 438/618 |
| 7,723,851 B2 * | 5/2010 | La Tulipe et al. | ............ | 257/761 |

(Continued)

FOREIGN PATENT DOCUMENTS

| KR | 10-2004-0012916 | 2/2004 |
|---|---|---|
| KR | 10-2005-0031876 | 4/2005 |

(Continued)

OTHER PUBLICATIONS

Chiarella et al., "Benchmarking SOI and bulk FinFET alternatives for PLANAR CMOS scaling succession",Solid-State Electronics 54 (2010) 855-860.*

(Continued)

*Primary Examiner* — A. Sefer
*Assistant Examiner* — Vincent Wall
(74) *Attorney, Agent, or Firm* — Jones Day

(57) ABSTRACT

A semiconductor structure having multiple semiconductor-device layers is provided. The semiconductor structure comprises a first buried oxide and a first semiconductor device layer fabricated above the first buried oxide. The first semiconductor device layer comprises a patterned top surface. A blanket layer comprising insulator material is fabricated over the patterned surface. The semiconductor structure further comprises a second buried oxide bonded to the blanket layer and a second semiconductor device layer fabricated above the second buried oxide.

21 Claims, 19 Drawing Sheets

(56) References Cited

U.S. PATENT DOCUMENTS

| | | | |
|---|---|---|---|
| 7,875,952 B1* | 1/2011 | Elliott | H01L 21/8221 257/499 |
| 8,421,126 B2 | 4/2013 | Bernstein et al. | |
| 2002/0185684 A1* | 12/2002 | Campbell | H01L 21/743 257/347 |
| 2003/0129829 A1* | 7/2003 | Greenlaw | 438/637 |
| 2005/0067620 A1* | 3/2005 | Chan | H01L 21/6835 257/67 |
| 2009/0070727 A1* | 3/2009 | Solomon | G06F 17/5045 716/128 |
| 2014/0197377 A1* | 7/2014 | Kim | H01L 27/092 257/29 |

FOREIGN PATENT DOCUMENTS

| | | |
|---|---|---|
| KR | 10-2006-0031676 | 4/2006 |
| KR | 2006-0031676 | 4/2006 |
| KR | 10-2007-0008234 | 1/2007 |
| KR | 2007-0008234 | 1/2007 |
| WO | 2009033837 A2 | 3/2009 |
| WO | 2013095646 | 6/2013 |

OTHER PUBLICATIONS

Korean Office Action; Application No. 10-2014-0122102; dated Sep. 16, 2015.
Korean Office Action; Application No. 10-2014-0122102; dated Feb. 4, 2016.
Korean Final Office Action; Application No. 10-2014-0122102; dated Jul. 12, 2016.
Korean Office Action; Application No. 10-2016-0181511; dated Feb. 10, 2017.
Chinese Office Action; Application No. 201410371182.3; dated Jan. 24, 2017.

* cited by examiner cut-pline 1: ALONG FIN

SYSTEMS AND METHODS FOR A SEMICONDUCTOR STRUCTURE HAVING MULTIPLE SEMICONDUCTOR-DEVICE LAYERS

FIELD

The technology described in this patent document relates generally to semiconductor devices and more particularly to a semiconductor structure having multiple semiconductor device layers.

BACKGROUND

Integrated circuits ("ICs") may comprise one or more types of semiconductor devices such as n-channel MOSFET ("NMOS") devices, p-channel MOSFET ("PMOS") devices, bipolar junction transistor ("BJT") devices, diode devices, and capacitors devices among others. Different types of devices can present different design considerations for a semiconductor designer. ICs may also include circuits that have different circuit functions such as ICs having analog functions, logic functions and memory functions.

SUMMARY

In accordance with the teachings described herein, a semiconductor structure having multiple semiconductor-device layers is provided. In one example, the semiconductor structure comprises a first buried oxide and a first semiconductor device layer fabricated above the first buried oxide. The first semiconductor device layer comprises a patterned top surface. A blanket layer comprising insulator material is fabricated over the patterned surface. The semiconductor structure further comprises a second buried oxide bonded to the blanket layer and a second semiconductor device layer fabricated above the second buried oxide.

In another example, a method of fabricating a multi-semiconductor device layer structure is provided. The method comprises providing a first wafer comprising first channel material bonded to a first buried oxide layer and fabricating a first semiconductor device layer from the first channel material. The first semiconductor device layer comprises a patterned top surface. The method further comprises fabricating a blanket layer comprising insulator material over the patterned surface, providing a second wafer comprising second channel material bonded to a second buried oxide layer, bonding the second buried oxide to the blanket layer, fabricating a second semiconductor device layer from the second channel material, and interconnecting a feature of the first semiconductor device layer with a feature of the second semiconductor device layer.

In yet another example, a method of fabricating a multi-semiconductor device layer structure is provided. The method comprises providing a first SOI wafer comprising first channel material bonded to a first buried oxide layer and fabricating a first semiconductor device layer from the first channel material. The first semiconductor device layer comprises a patterned top surface. The method further comprises fabricating a blanket layer comprising insulator material over the patterned surface, bonding a second wafer comprising second channel material and second buried oxide to the blanket layer, and fabricating a second semiconductor device layer from the second channel material.

DETAILED DESCRIPTION

Figure 1:
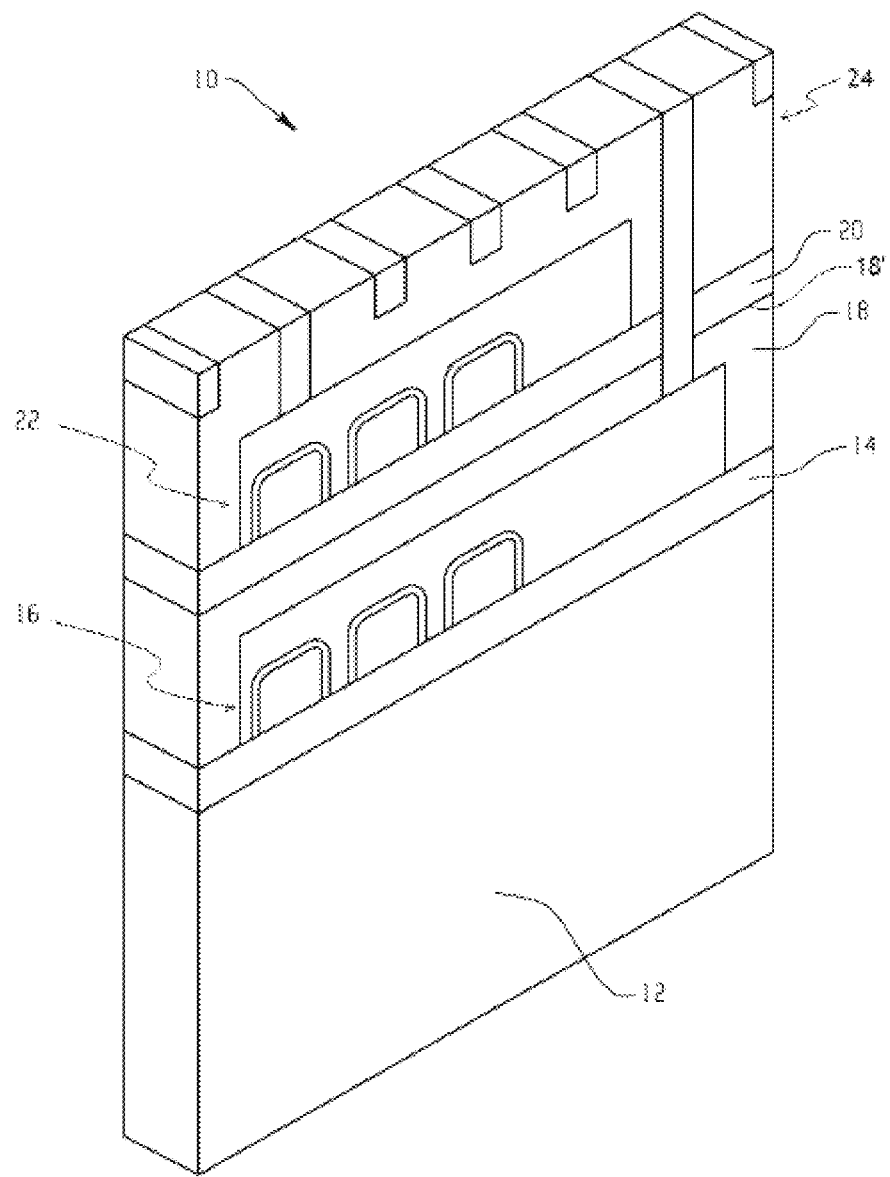
FIG. 1 is a cross-sectional view of an example semiconductor structure having multiple transistor layers.

The use of two or more semiconductor device layers in a semiconductor structure may, in some implementations, simplify semiconductor fabrication while allowing for the advantageous use of certain channel material in the fabrication of some semiconductor devices and the use of different channel material in the fabrication of other semiconductor devices. FIG. 1 is a cross-sectional view of an example semiconductor structure 10 having multiple transistor layers. The semiconductor structure comprises a first transistor layer 16 fabricated from a semiconductor-on-insulator ("SOI") and a second transistor layer 22 fabricated from a second SOI structure. In particular the semiconductor structure 10 comprises a substrate 12, a first buried oxide layer 14 above the substrate 12, a first transistor layer 16 above the buried oxide 14, a blanket layer 18 comprised of an interlayer dielectric oxide material (ILD0) disposed over the first transistor layer 16, a second buried oxide layer 20 above the blanket layer 18, a second transistor layer 22 above the second buried oxide 20, and a back-end-of-line ("BEOL") layer 24 above the second transistor layer 22. The first transistor layer 16 comprises multiple components such as source regions, drain regions, and gate regions of transistors, ILD0 oxide, nitride spacers, and metal material. The blanket layer 18 disposed over the top surface of the first transistor layer 16 has a blanket surface 18' comprised ILD0 oxide material.

Forming the semiconductor structure comprises bonding a second buried oxide layer and channel material to the blanket surface 18' on top of a first transistor layer 16. To form the blanket surface, 18', a blanket (i.e., single material; no patterned features; no topography) insulator material such as oxide-based material is deposited on the top of the first transistor layer. The bonding interface between the second buried oxide layer 20 and the blanket surface 18' comprises homogeneous materials and can have a stronger and more uniform linkage than a bond between a non-homogenous interface such as between the second buried oxide and the patterned surface underneath the blanket surface.

Use of a blanket surface (e.g., the blanket surface 18' of the ILD0 blanket layer 18) can allow for the fabrication of a first transistor type on the first transistor layer 16 and fabrication of a second transistor type on a second transistor layer 22 because of compatible electric characteristic behavior such as bulk leakage control for both the first and second transistor (e.g., SOI NMOS transistor for first layer and SOI PMOS transistor for the second layer). The thickness of the blanket layer 18, also referred to as a glue/buffer layer, can be restricted by the process limitation of the deepest contact hole etching and filling. For example, a feasible depth for contact hole etching and filling may be 50 nm~150 nm with a diameter of about 15 nm~40 nm for an N10-N32 (10 nanometer to 32 nanometer) technology node. In this example, the aspect ratio, i.e., depth of contact hole relative to the opening diameter of the contact hole, is smaller than about 10. Therefore, the thickness of the buried oxide and the buffer/glue oxide should be appropriately designed and minimized. In this example, the oxide layer thickness (IMD1

) of the BEOL layer 24 is about 40 nm; the fin height of second transistor is about 20 nm~35 nm; the gate height above the fin top is about 35 nm~45 nm; the buried oxide height is about 10 nm~20 nm; and the buffer/glue oxide height is about 10 nm~20 nm.

Figure 2:
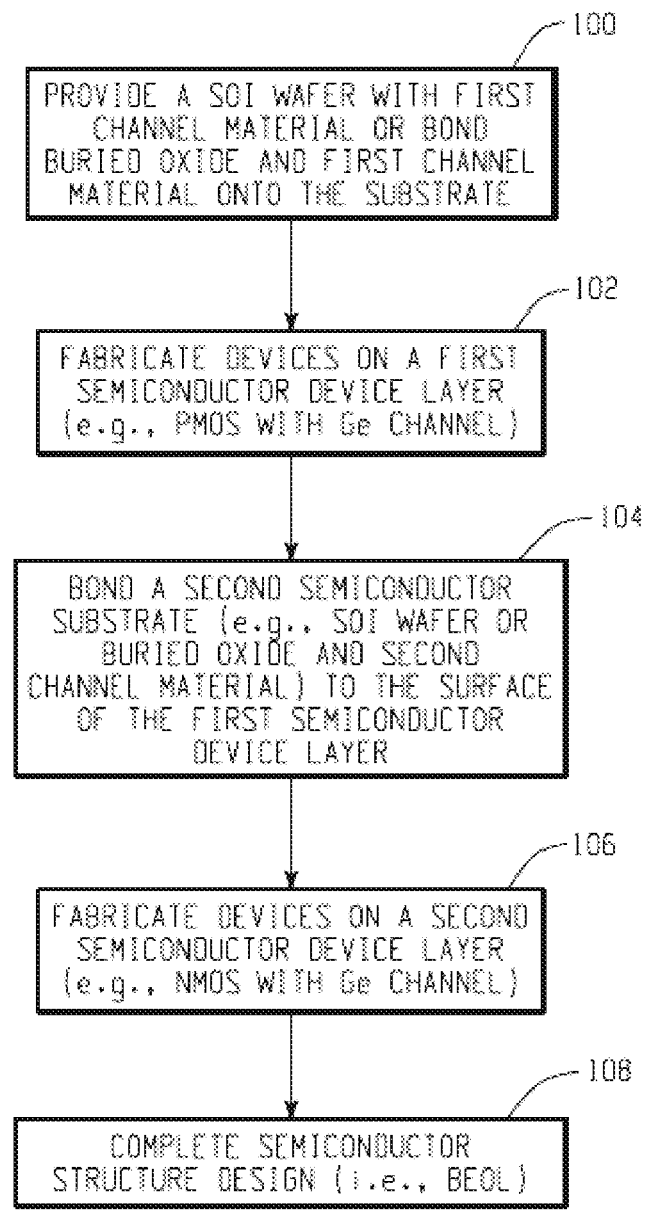
FIGS. 2-5 are process flow charts depicting example methods for generating a multilayer semiconductor device structure.

FIG. 2 is a process flow chart depicting an example method for creating a multi-layer semiconductor structure having two semiconductor device (or transistor) layers. At operation 100, a first semiconductor-on-insulator ("SOI") wafer with the first channel material is provided for the first layer. Alternatively, at operation 100, a substrate with bond buried oxide and the first channel material may be provided.

At operation 102, the first transistor layer is fabricated. The first transistor layer may be fabricated using suitable processes including photolithography, etching, cleaning, chemical mechanical polishing/planarization ("CMP"), thin film deposition, thermal process (e.g., doping, activation/surface, passivation/material consolidation), epitaxy, and material filling, among others. For example, the photolithography process may include forming a photoresist layer (resist), exposing the resist to a pattern, performing post-exposure bake processes, and developing the resist to form a masking element. The masking element may then be used in an etching process. The etching may be performed using reactive ion etch ("RIE") and/or other suitable processes. The fabrication of the first transistor level includes fabricating a buffer layer on the top of the first transistor level.

After the devices on the first semiconductor layer are fabricated, a second semiconductor substrate is provided and bonded to the top surface (i.e., the buffer layer) of the first semiconductor device layer (operation 104). The second semiconductor substrate comprises a semiconductor on insulator ("SOI") substrate. The bottom surface of the insulator of the SOI substrate is bonded to the top surface of the first semiconductor layer. In some embodiments, the bonding surface of the insulator and top surface of the buffer layer are processed to clean, remove excess particles, and make the surfaces hydrophobic or hydrophilic. After the surfaces are processed, the wafer containing the first semiconductor layer and the wafer containing the SOI substrate are aligned. After alignment the layers can be bonded through a touch and press process. The Van der Waals force will link the atoms of the interface between the bottom of the second semiconductor layer and the top of the first semiconductor layer together (this process may involve some plasma enhancement technique). Also a thermal procedure can be applied to enhance the linking of atoms at the interface. The resultant semiconductor structure can have a planarization process or CMP process applied to reduce the thickness of second semiconductor layer to the required thickness.

After bonding, a second semiconductor device layer is fabricated on the second semiconductor substrate (operation 106). The second semiconductor layer may be fabricated using a number of suitable processes including photolithography, etching, cleaning, chemical mechanical polishing/planarization ("CMP"), thin film deposition, thermal process, epitaxy, and material filling, among others.

The second semiconductor substrate has a semiconductor on insulator ("SOI") structure comprising a buried oxide and a second channel material. The buried oxide functions as an electrical insulator underneath the semiconductor channel material. The buried oxide may be formed from material such as $SiO_2$, HfO, $Al_2O_3$ or other suitable oxide material. The electrical insulator functions to insulate the second channel material in the second semiconductor substrate from the devices formed on the first semiconductor device layer.

The second channel material may be formed from material such as Si, SiGe, GaAs, or others. The second channel material may be the same as or different from the semiconductor channel material used in the first semiconductor device layer. This can allow for selectively constructing certain semiconductor devices with the channel material of the first semiconductor substrate and other semiconductor devices with the channel material of the second semiconductor substrate. For example, the channel material of the first semiconductor substrate may be Ge and used for fabricating PMOS devices, and the channel material of the second semiconductor substrate may be GaAs and used for fabricating NMOS devices for boosting the performance of NMOS and PMOS transistors.

After fabricating the second semiconductor device layer, the semiconductor structure can be completed (operation 108). Completion comprises back end of line ("BEOL") operations where the individual devices are interconnected with wiring on the multi-layer semiconductor structure. BEOL may include fabrication of contacts, insulating layers (dielectrics), metal levels, and bonding sites for chip-to-package connections.

Figure 3:
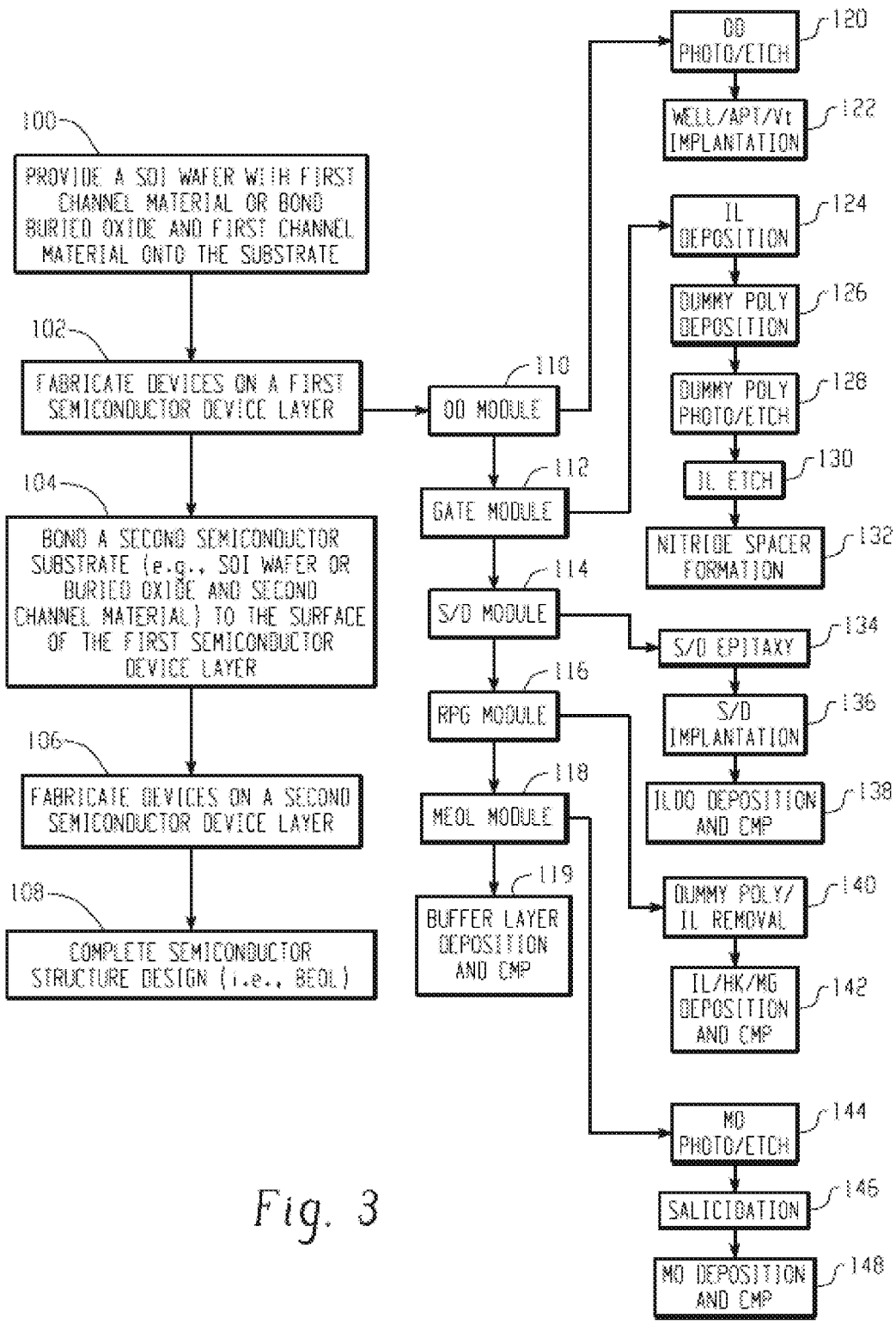

FIG. 3 is a process flow chart depicting another example method for creating a multi-layer semiconductor structure having two semiconductor device layers. This example method comprises providing a SOI wafer or bond buried oxide and first channel material on a substrate (operation 100), fabricating the first semiconductor layer with a blanket top surface on a buffer layer (operation 102), bonding the bottom insulator surface of a SOI substrate (or bond buried oxide and channel material) to the top blanket surface of the first semiconductor layer (operation 104), fabricating the second device layer on the SOI substrate (operation 106), and completing the semiconductor structure with wiring and metallization layers (operation 108). The example method of FIG. 3 is similar to the example method of FIG. 2, but provides specific examples regarding how the first semiconductor layer may be fabricated.

In particular, fabrication of devices in the first semiconductor device layer, in this example, involves an oxidation ("OD") module process (operation 110), a gate module process (operation 112), a source/drain module process (operation 114), a remove poly gate ("RPG") module process (operation 116), a middle end of line ("MEOL") module process (operation 118), and a buffer layer deposition and CMP process (operation 119).

Figure 6:
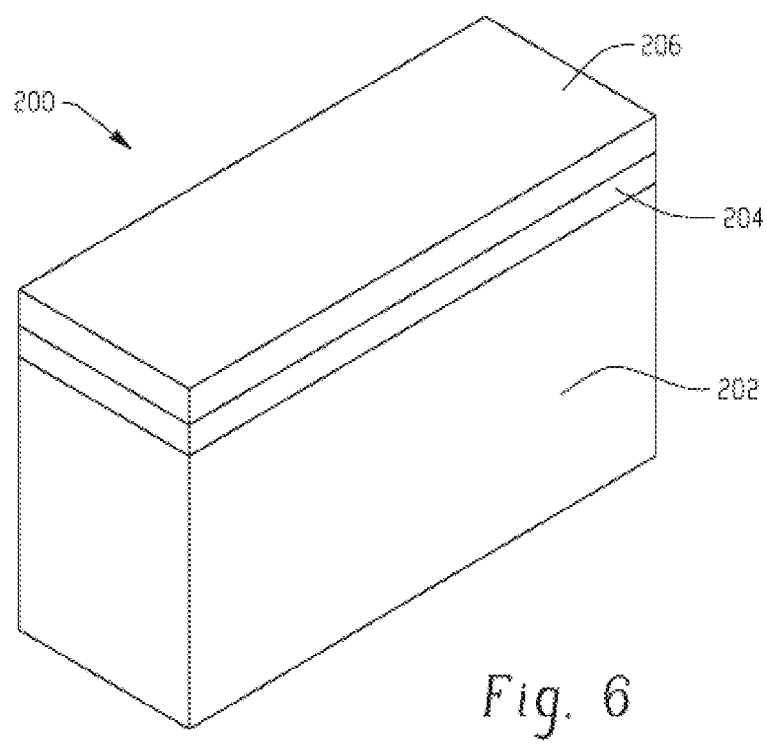
FIGS. 6-22 are drawings depicting example states of a semiconductor structure during fabrication of a multilayer semiconductor structure.

FIG. 6 depicts an isometric view of an example portion of a SOI wafer 200 that may be provided for use with the methods described in FIG. 3 to fabricate a multi-layer semiconductor structure. The SOI wafer 200 comprises a silicon substrate 202 with a buried oxide layer 204 and first channel material 206 above the buried oxide layer 204. The first channel material may comprise Ge with N-well implantation. The buried oxide layer 204 may be formed from material such as $SiO_2$, $HfO_2$, $Al_2O_3$ or other suitable oxide material.

Referring back to FIG. 3, the OD module process (operation 110) may involve a number of iterations of isolation oxide deposition and planarizing, photolithography and etching operations (operation 120), and diffusion/ion implantation operations (operation 122) such as P-well or N-well implantation, $P^+$ implantation, and $N^+$ implantation.

Figure 7:
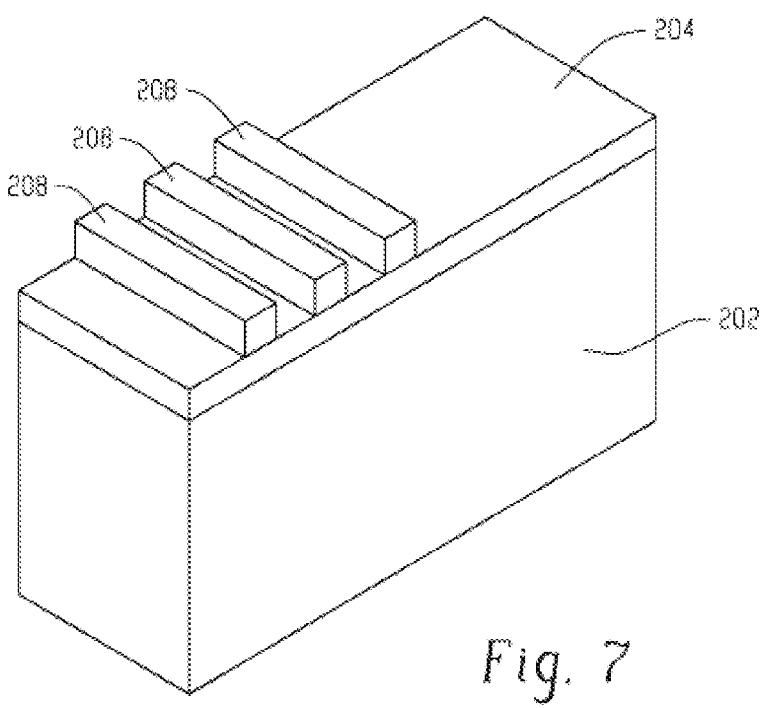

FIG. 7 depicts an isometric view of a portion of the semiconductor structure after completion of the OD module process (operation 110 of FIG. 3). Shown are OD fins 208 for the NMOS transistor above the buried oxide layer 204, which in turn is above the substrate 202.

Referring back to FIG. 3, the gate module process (operation 112) involves operations such as depositing isolation oxide material (operation 124), dummy poly deposition (operation 126), dummy poly photolithography/etching (operation 128), etching isolation oxide material (operation 130), and nitride spacer formation (operation 132).

Figure 8A:
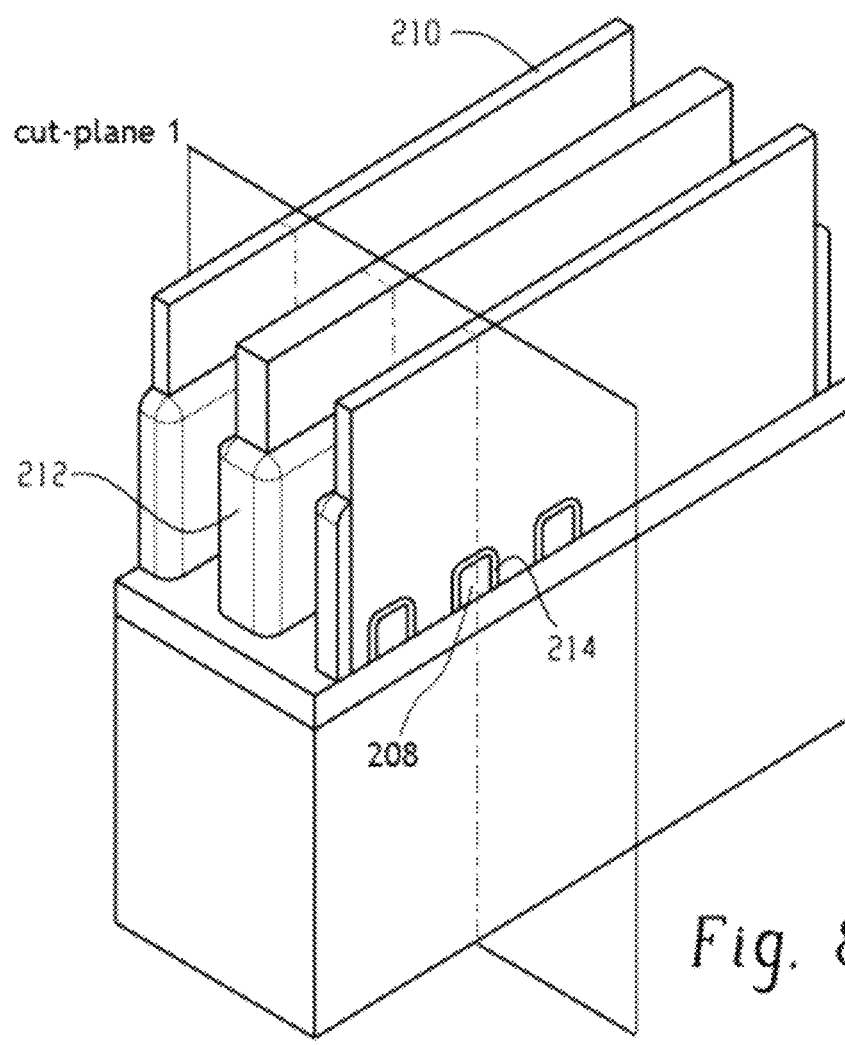
Figure 8B:
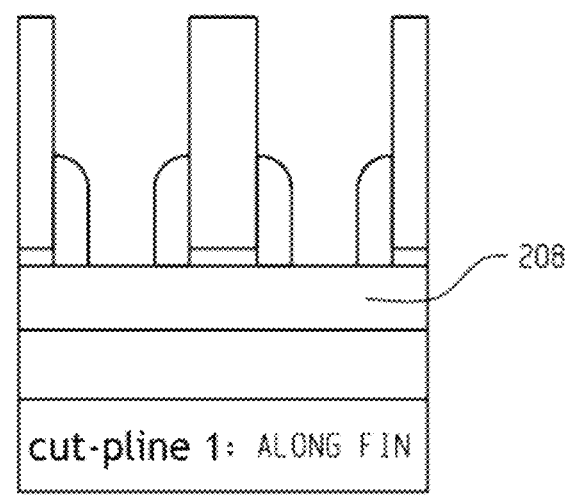

FIG. 8A depicts an isometric view of a portion of the semiconductor structure after completion of the gate module process (operation 112 of FIG. 3). FIG. 8B provides a cross-sectional view of the semiconductor structure from cutline 1 of FIG. 8A. Shown are dummy poly 210, nitride spacers 212, and dummy isolation oxide 214. The channel material that makes up the OD fins 208 may comprise Ge with N-well implantation.

Referring back to FIG. 3, the source/drain module process (operation 114) may involve source/drain epitaxial growth operations (operation 134), source/drain implantation operations (operation 136), and interlayer dielectric deposition and etching (operation 138).

Figure 9A:
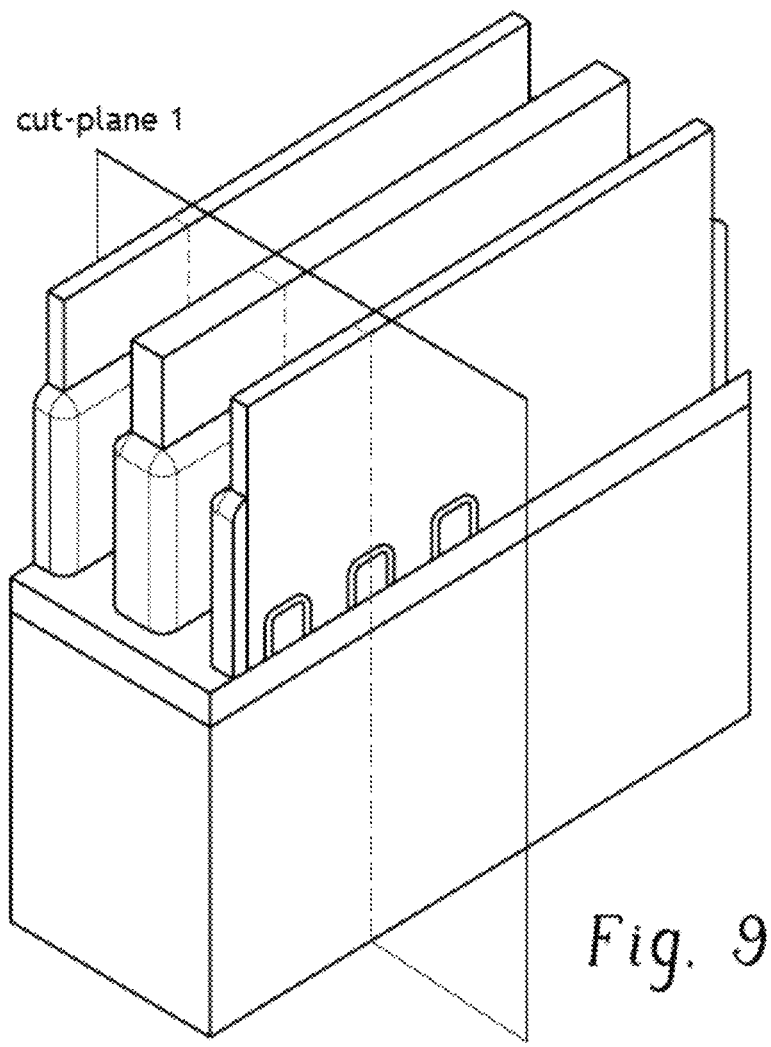
Figure 9B:
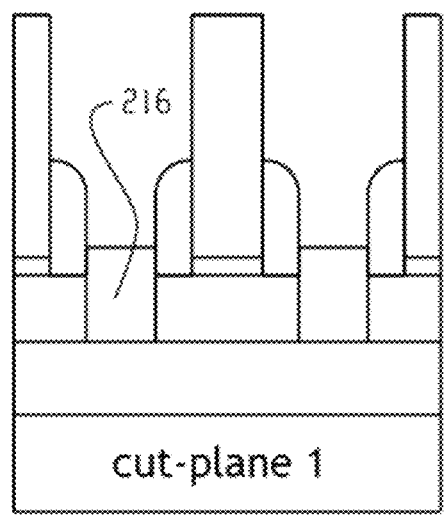

FIG. 9A depicts an isometric view of the semiconductor structure after source/drain epitaxial growth operations (operation 134 of FIG. 3) and source/drain implantation operations (operation 136 of FIG. 3). FIG. 9B provides a cross-sectional view of the semiconductor structure from cutline 1 of FIG. 9A. Particular, FIG.9B shows the source/drain material 216 after epitaxy and P+ implantation (which is located between the dummy poly gate 210/nitride spacer 212 and thus hidden from view in FIG. 9A).

Figure 10A:
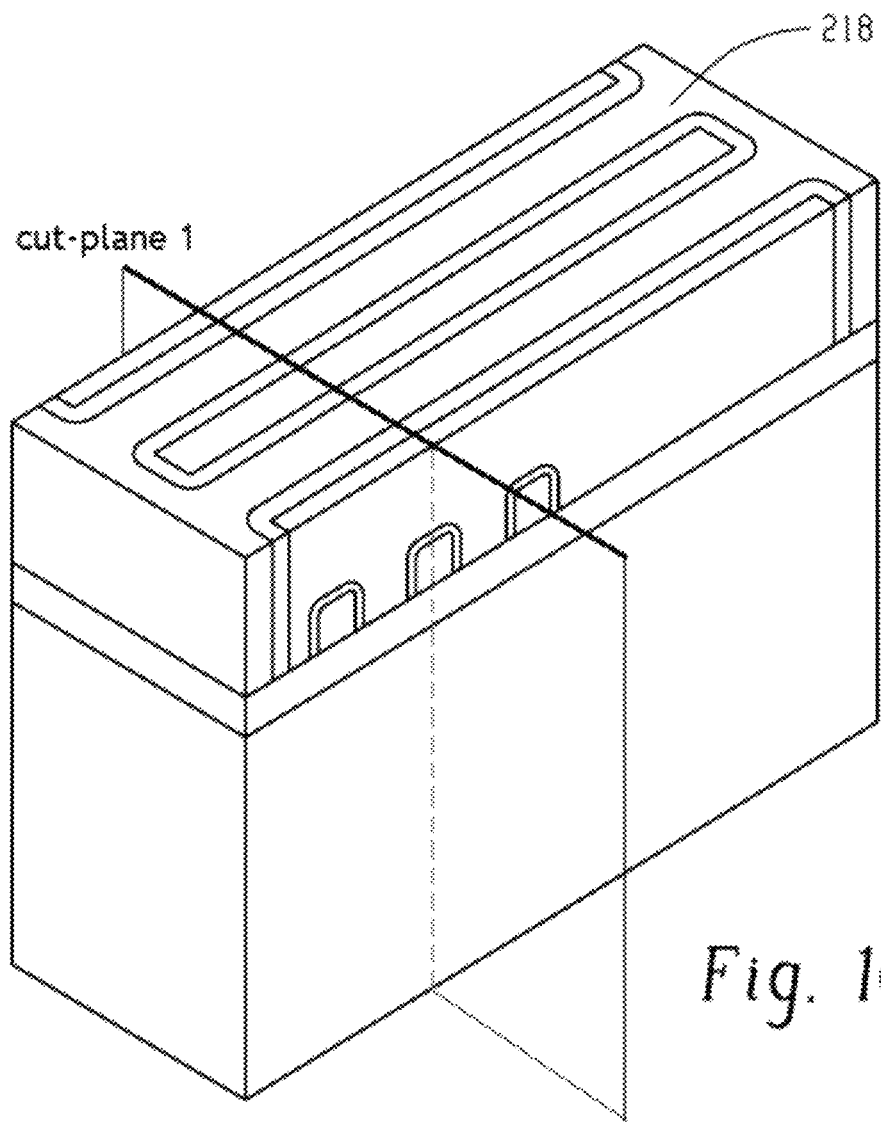
Figure 10B:
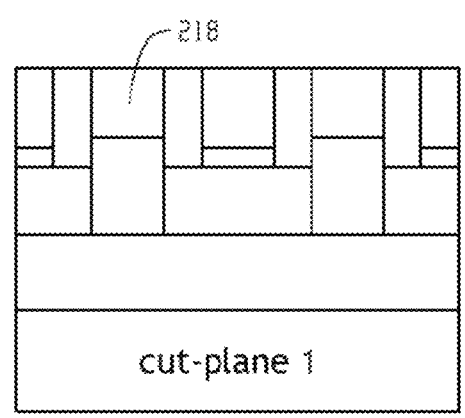

FIG. 10A depicts an isometric view of a portion of the semiconductor structure after interlayer dielectric deposition and etching (operation 138 of FIG. 3). FIG. 10B provides a cross-sectional view of the semiconductor structure from cutline 1 of FIG. 10A. Shown is the deposited interlayer dielectric material 218.

Referring back to FIG. 3, the remove poly gate module process (operation 116) involves dummy poly/isolation oxide removal (operation 140) and isolation oxide/high K/metal gate deposition and CMP (operation 142). The MEOL module process (operation 118) may involve M0 photolithography and etching operations (operation 144), salicidation (operation 146), and M0 deposition and CMP (operation 148).

Figure 11A:
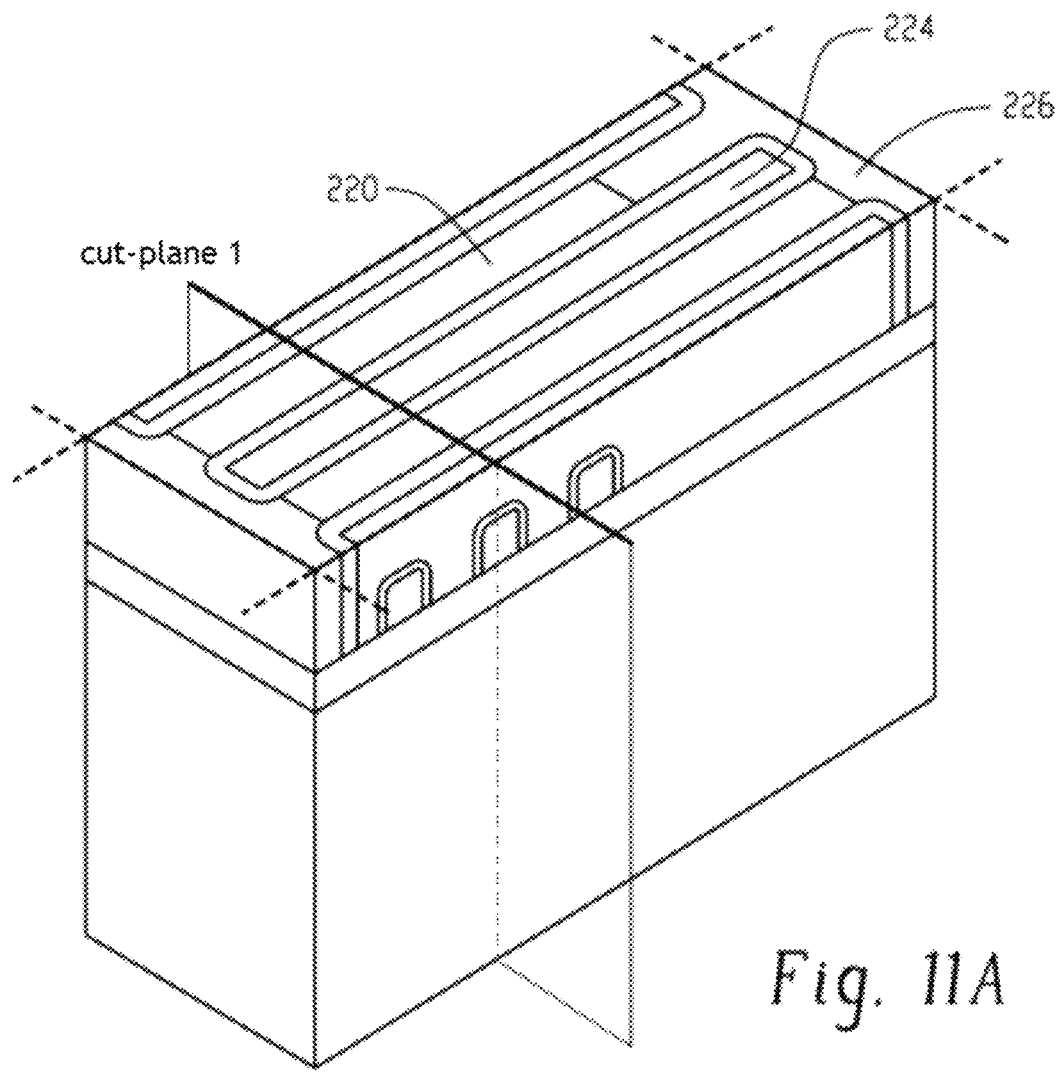
Figure 11B:
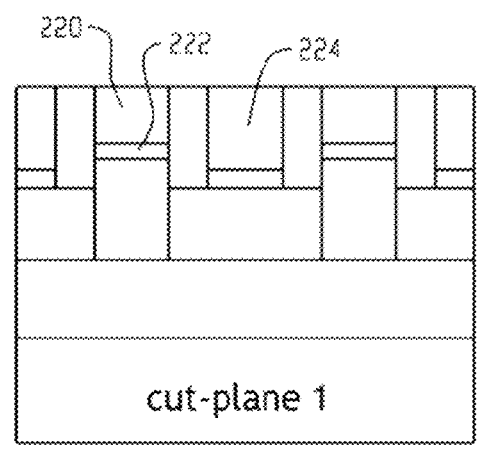

FIG. 11A depicts an isometric view of a portion of the semiconductor structure after the MEOL module process (operation 122 of FIG. 3). FIG. 11B provides a cross-sectional view of the semiconductor structure from cutline 1 of FIG. 11A. These figures show the addition of M0 metal material 220 and silicide 222 above source and drain regions and also show deposited metal gate material 224. The top surface 226 of first transistor layer has patterned features and is composed of several non-homogenous materials such as metal gate, nitride spacer, M0 metal and ILD0 oxide.

Referring back to FIG. 3, the buffer layer deposition and CMP process (operation 119) results in a glue/buffer layer being deposited onto the top surface of the first transistor layer to produce a uniform, non-patterned, no topography and homogeneous surface for wafer bonding. In this example, a feasible thickness for this layer is about 10 nm~20 nm in view of the depth of subsequent contact etching and filling.

Figure 12A:
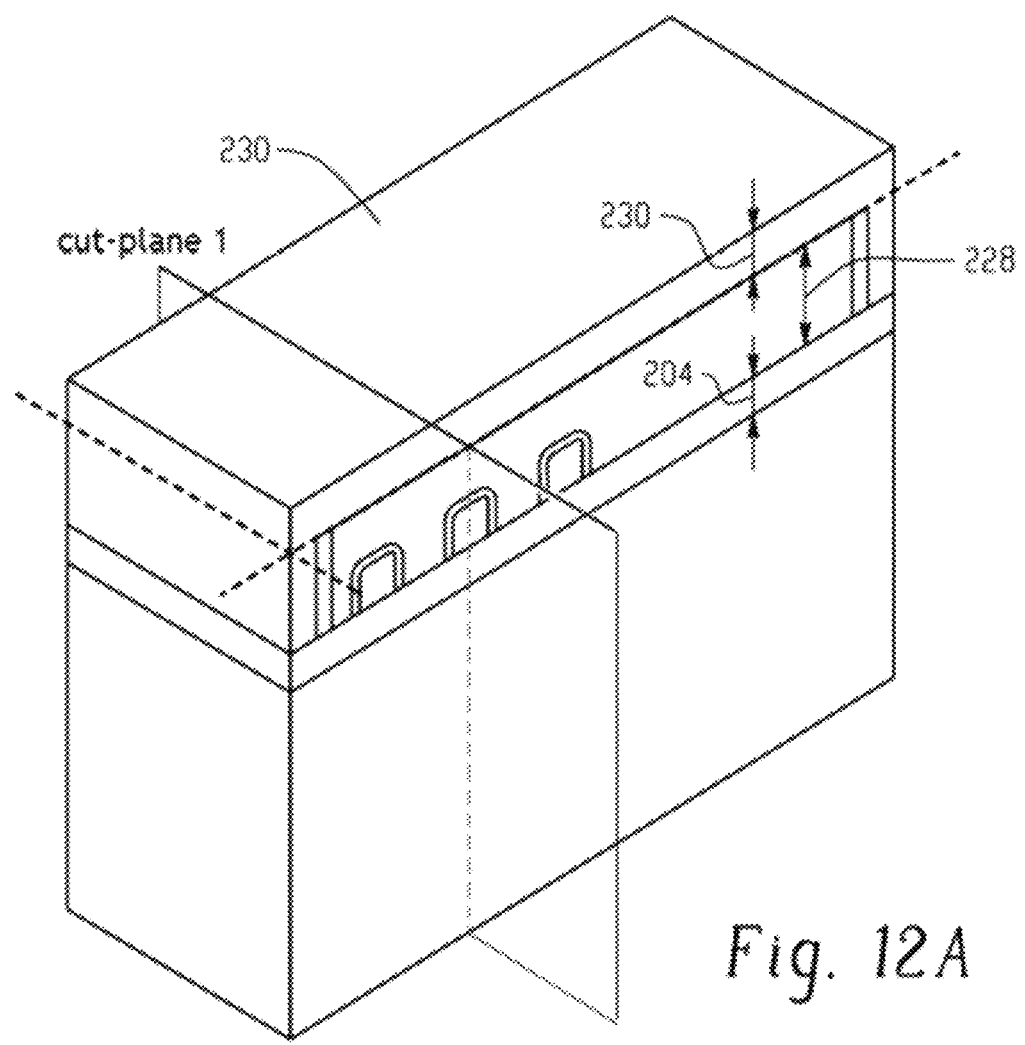
Figure 12B:
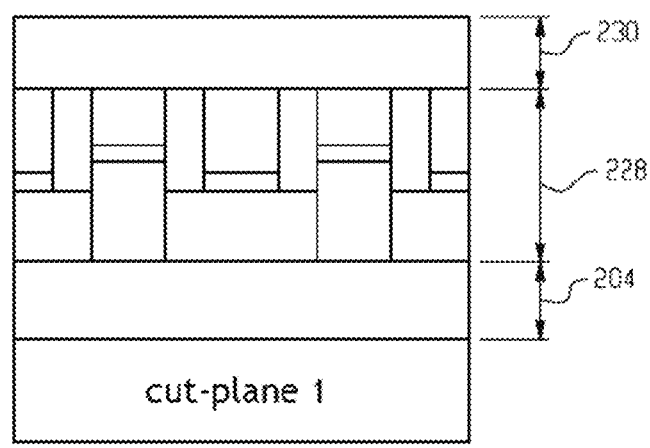

FIG. 12A depicts an isometric view of a portion of the semiconductor structure after the buffer layer deposition and CMP process (operation 119 of FIG. 3). FIG. 11B provides a cross-sectional view of the semiconductor structure from cutline 1 of FIG. 11A. These figures show the buried oxide 204 of the first transistor layer 228, and the glue/buffer layer 230.

Figure 4:
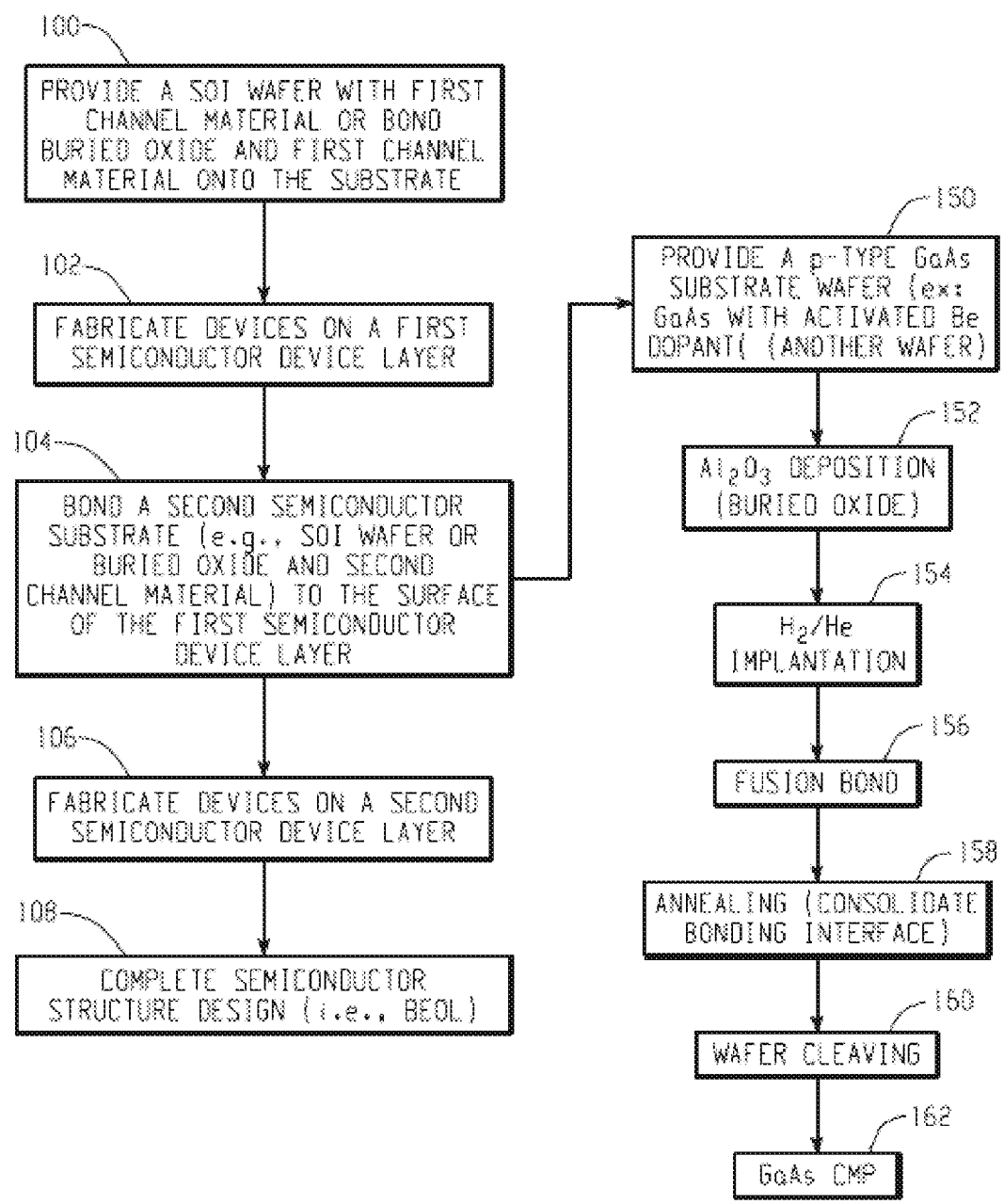

FIG. 4 is a process flow chart depicting another example method for creating a multi-layer semiconductor structure having two semiconductor device layers. This example method comprises providing a SOI wafer or bond buried oxide and first channel material on a substrate (operation 100), fabricating the first semiconductor layer with a blanket top surface on a buffer layer (operation 102), bonding the bottom insulator surface of a SOI substrate (or bond buried oxide and channel material) to the top blanket surface of the first semiconductor layer (operation 104), fabricating the second device layer on the SOI substrate (operation 106), and completing the semiconductor structure with wiring and metallization layers (operation 108). The example method of FIG. 4 is similar to the example method of FIG. 2, but provides specific examples regarding how the second semiconductor substrate may be bonded to the surface of the first semiconductor device.

Figure 13:
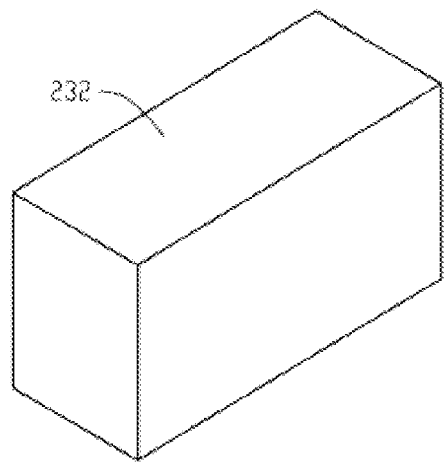

In particular, referring to FIG. 4, bonding the bottom insulator surface of a second SOI substrate (or bond buried oxide and channel material) to the top blanket surface of the first semiconductor layer, in this example, comprises providing a separate substrate (operation 150). As an example, the substrate may comprise GaAs with an activated Be dopant. FIG. 13 depicts an isometric view of the separate second substrate 232. In this example, the substrate comprises GaAs with P-well implantation.

Figure 14:
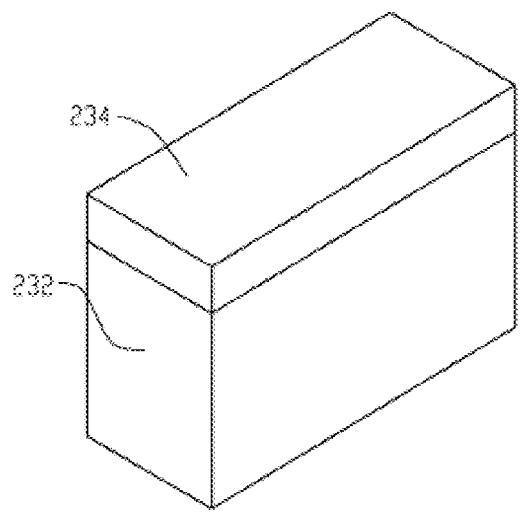

Referring back to FIG. 4, bonding the bottom insulator surface of a SOI substrate (or bond buried oxide and channel material) to the top blanket surface of the first semiconductor layer further comprises depositing a defect free buried oxide layer (operation 152) onto the substrate. FIG. 14 depicts an isometric view of the second substrate 232 with deposited buried oxide 234. In this example, the buried oxide comprises Al2O3, HfO2, SiO2, or some other suitable oxide material. In this example, the thickness of this layer is about 10 nm~20 nm.

Figure 15:
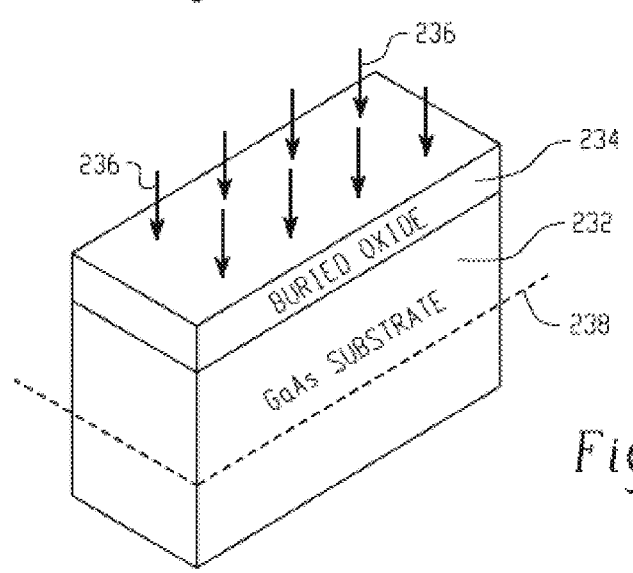

Referring back to FIG. 4, bonding the bottom insulator surface of a SOI substrate (or bond buried oxide and channel material) to the top blanket surface of the first semiconductor layer further comprises H2/He implantation (operation 154). FIG. 15 depicts an isometric view of the deposited buried oxide 234 and the second substrate 232 subjected to H2/He implantation to introduce the H2/He 236 into the GaAs substrate 232 to create a H2/He implantation layer level 238 that weakens the interface atom linkage.

Figure 16:
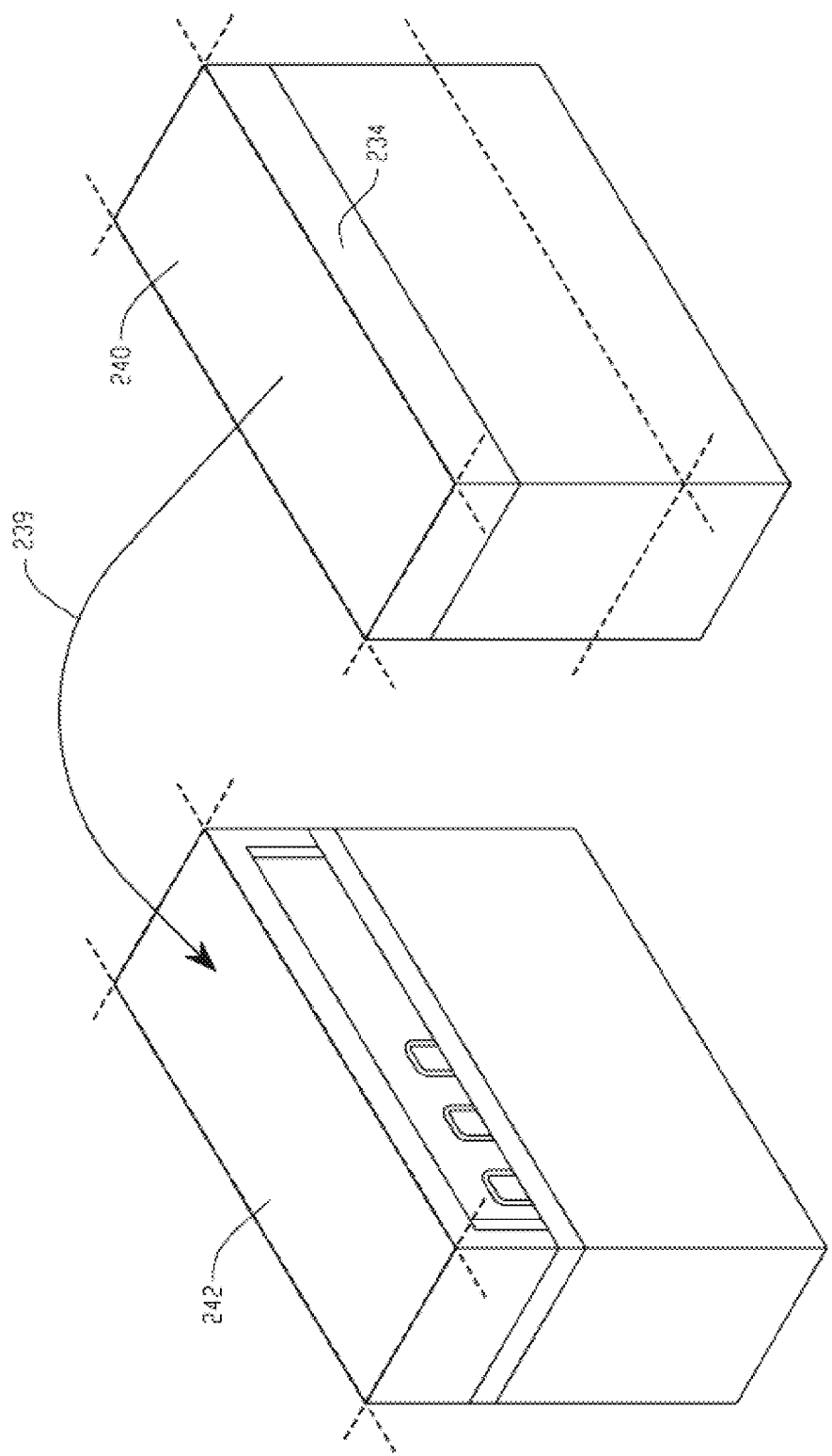

Referring back to FIG. 4, at operation 156, bonding the top surface of the buried oxide layer onto the top blanket surface of the first transistor level takes place. FIG. 16 provides an illustration using an arrow 239 of bonding the top surface 240 of the buried oxide layer 234 to the top blanket surface 242 of the first transistor level. The two bonding surfaces 240, 242 should be planarized to minimize the surface roughness and clean the surface to remove particles before bonding.

Figure 17:
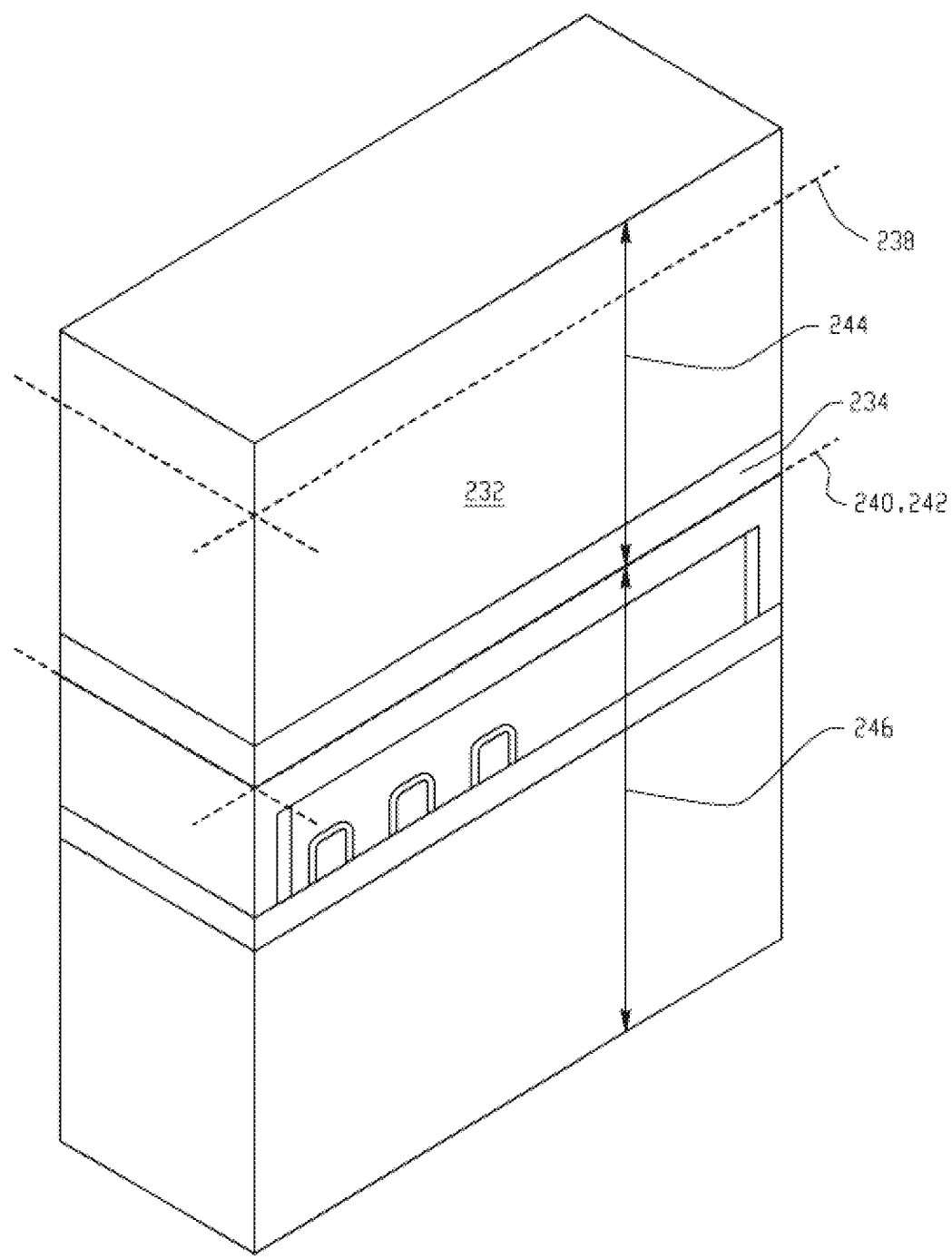

Referring back to FIG. 4, bonding the bottom insulator surface of a SOI substrate (or bond buried oxide and channel material) to the top patterned surface of the first semiconductor layer further comprises annealing operations to consolidate the bonding interface (operation 158). FIG. 17 depicts an isometric view of the semiconductor structure after annealing operations. Shown are the second substrate 232, the buried oxide 234, and the H2/He implantation layer level 238 in the bonding wafer 244, bonding surfaces 240, 242, and wafer of first transistor layer 246.

Figure 18:
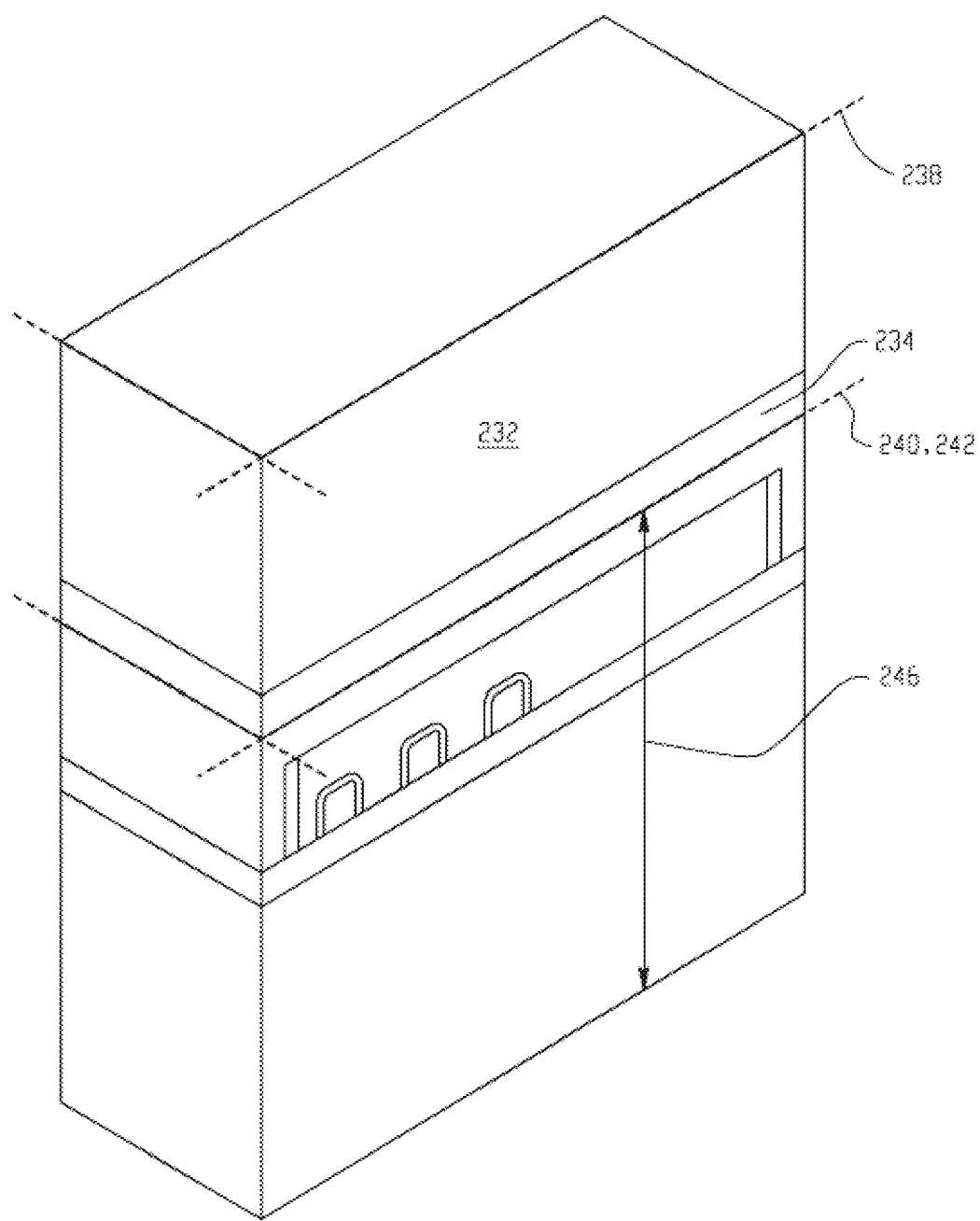

Referring back to FIG. 4, bonding the bottom insulator surface of a SOI substrate (or bond buried oxide and channel material) to the top patterned surface of the first semiconductor layer further comprises wafer cleaving (operation 160) at the H2/He implantation layer level 238. FIG. 18 depicts an isometric view of the semiconductor structure after wafer cleaving operations. The second substrate 232 has been cleaved at the H2/He implantation layer level 238, leaving a remaining portion 232' of the second substrate 232.

Figure 19:
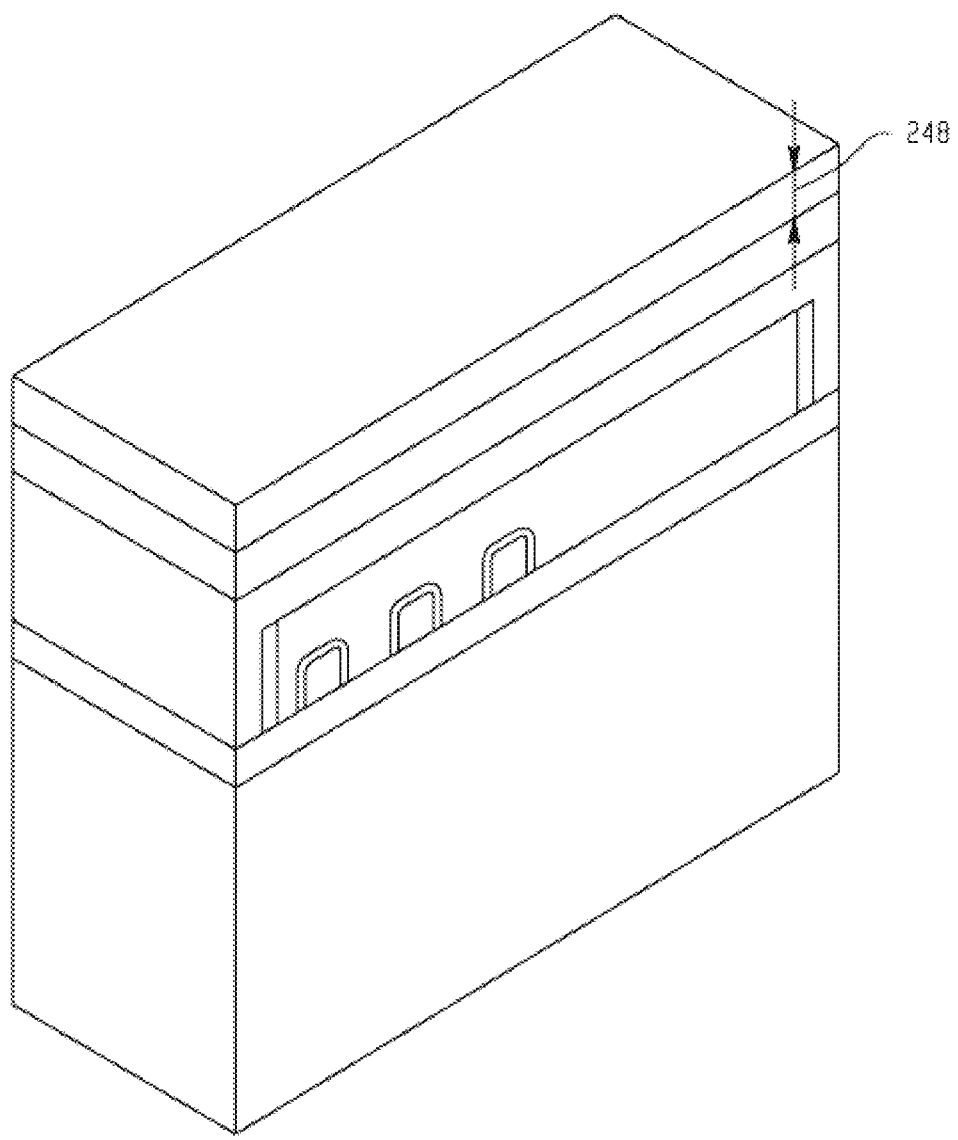

Referring back to FIG. 4, bonding the bottom insulator surface of a SOI substrate (or bond buried oxide and channel material) to the top patterned surface of the first semiconductor layer further comprises GaAs CMP (operation 162) to reduce the size of the GaAs substrate. FIG. 19 depicts an isometric view of the semiconductor structure after GaAs CMP. CMP for the GaAs channel material is undertaken to get the second channel material to a targeted thickness 248.

Figure 5:
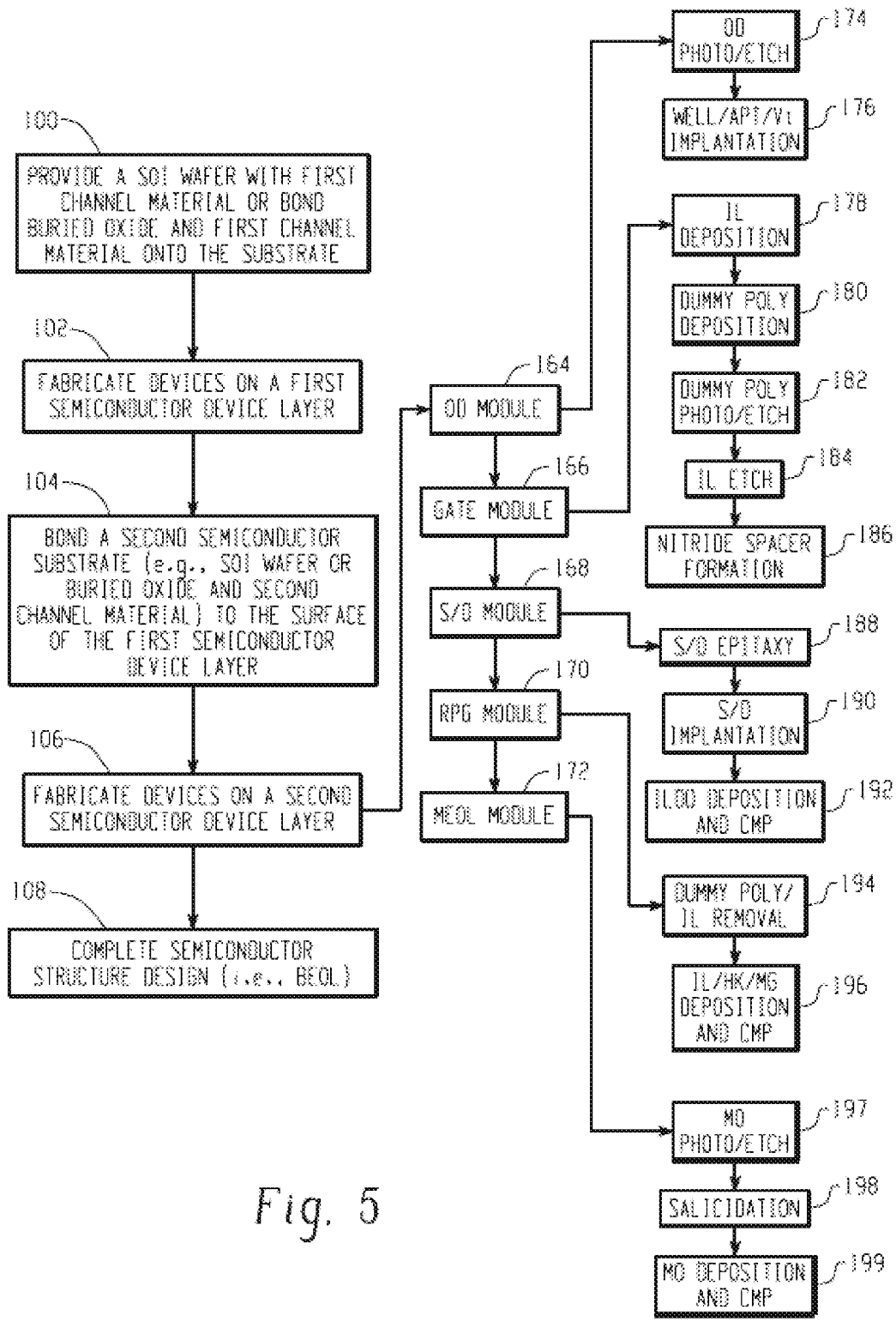

FIG. 5 is a process flow chart depicting another example method for creating a multi-layer semiconductor structure having two semiconductor device layers. This example method comprises providing a SOI wafer or bond buried oxide and first channel material on a substrate (operation 100), fabricating the first semiconductor layer with a blanket top surface on a buffer layer (operation 102), bonding the bottom insulator surface of a SOI substrate (or bond buried oxide and channel material) to the top blanket surface of the first semiconductor layer (operation 104), fabricating the second device layer on the SOI substrate (operation 106), and completing the semiconductor structure with wiring and metallization layers (operation 108). The example method of FIG. 5 is similar to the example method of FIG. 2, but provides specific examples regarding the second semiconductor layer may be fabricated.

In particular, fabrication of devices in the second semiconductor device layer, in this example, involves an oxidation ("OD") module process (operation 164), a gate module process (operation 166), a source/drain module process (operation 168), a remove poly gate module process (operation 170), and a middle end of line ("MEOL") module process (operation 172).

The OD module process (operation 148) may involve a number of iterations of isolation oxide deposition and planarizing, photolithography and etching operations (operation 174), and diffusion/ion implantation operations (operation 176) such as P-well or N-well implantation, P+ implantation, and N+ implantation.

The gate module process (operation 166) involves operations such as depositing isolation oxide material (operation 178), dummy poly deposition (operation 180), dummy poly photolithography/etching (operation 182), etching isolation oxide material (operation 184), and nitride spacer formation (operation 186).

The source/drain module process (operation 168), may involve source/drain epitaxial growth operations (operation 188), source/drain implantation operations (operation 190), and interlayer dielectric deposition and etching (operation 192).

The remove poly gate module process (operation 170) involves dummy poly/isolation oxide removal (operation 194) and isolation oxide/high K/metal gate deposition and CMP (operation 196).

The middle end of line ("MEOL") module process (operation 172), may involve M0 photolithography and etching operations (operation 197), salicidation (operation 198), and M0 deposition and CMP (operation 199).

Figure 20A:
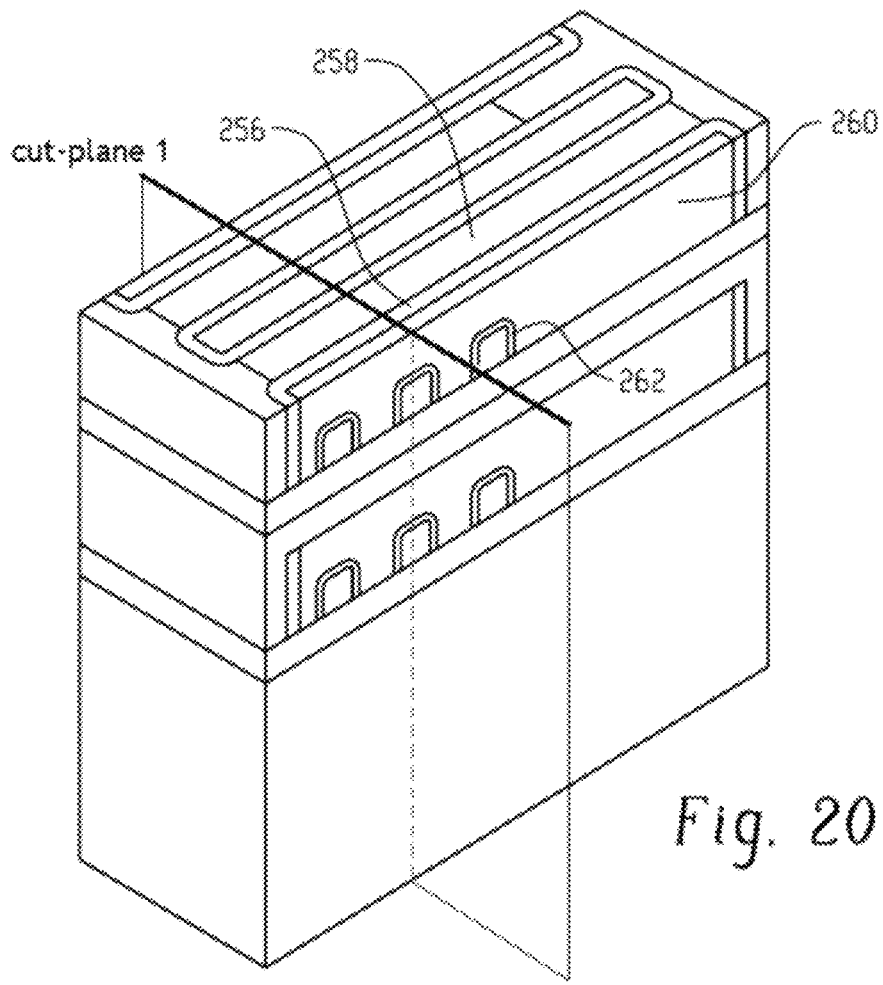
Figure 20B:
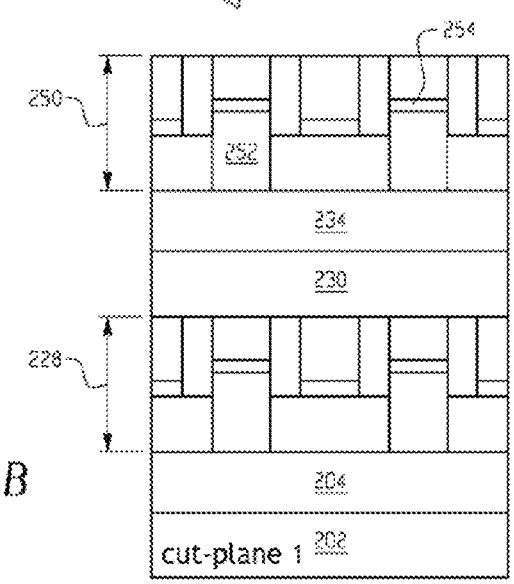

FIG. 20A depicts an isometric view of the semiconductor structure after fabrication of devices in the second semiconductor device layer. FIG. 20B provides a cross-sectional view of the semiconductor structure from cutline 1 of FIG. 20A. These figures show the first substrate 202, the first buried oxide layer 204, the first semiconductor device (or transistor) layer 228, the blanket (i.e., glue/bond) layer 230, the second buried oxide layer 234, and the second semiconductor device (or transistor) layer 250. The second transistor layer 250 comprises N+ source/drain regions 252, silicide 254, nitride spacers 256, M0 metal 258, metal gate 260, and high-K gate oxide 262.

Figure 21A:
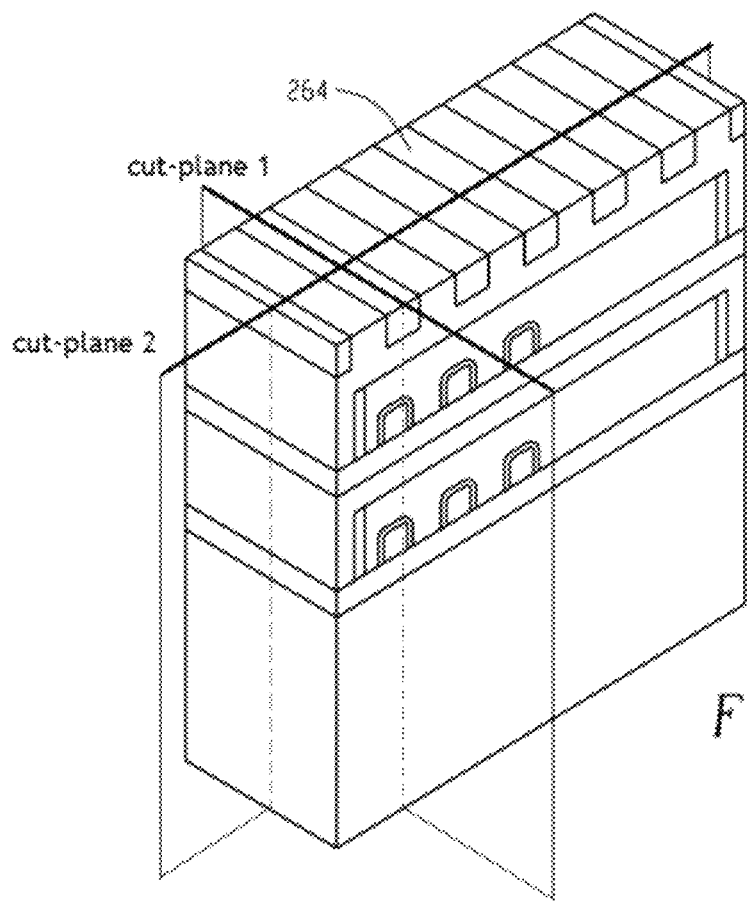
Figure 21B:
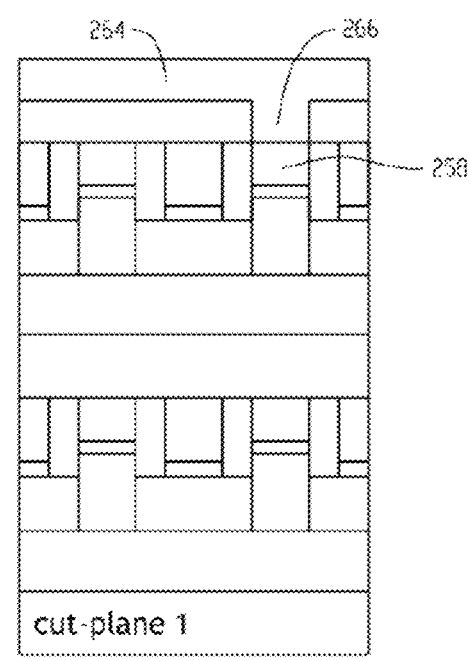

After the second semiconductor device layer is fabricated, BEOL operations may take place. FIG. 21A depicts an isometric view of the semiconductor structure after the BEOL operations (e.g., operation 108 of FIG. 5), including the addition of a M1 metal 264, are complete. FIG. 21B provides a cross-sectional view of the semiconductor structure from cutline 1 of FIG. 21A and also shows via0 266 from the M1 metal 264 to the M0 metal 258 of the second transistor level.

Figure 22:
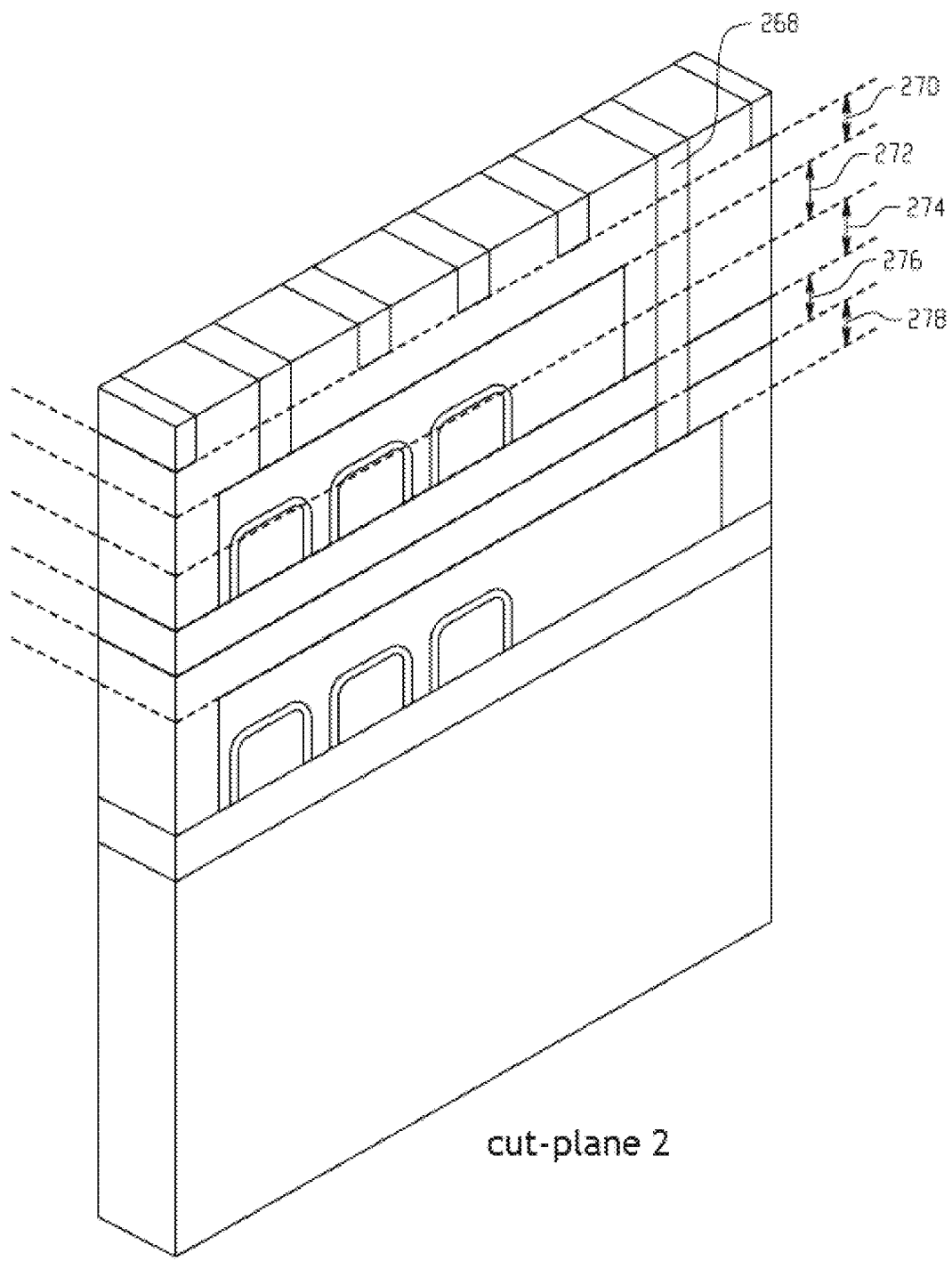

FIG. 22 illustrates the depth of an inter-level via in a multilevel semiconductor structure. The via0 268 with the greatest depth are the vias with an inter-level connection from M1 to the first M0 and from M1 to the first gate. Each of these via types will have to be etched through the depth of IMD1 270, the depth of the ILD0 oxide above the second transistor (as determined by the gate height above the fin top 272 plus the fin height of the second transistor 274), the depth of the buried oxide 276, the depth of the glue/buffer oxide 278, and the depth of the ILD0 of first transistor. In the illustrated example, the depth of the contact hole etching is designed to be smaller than 150 nm. In this example, the IMD1 oxide height is about 40 nm; fin height of second transistor is about 20 nm~35 nm; gate height above the fin top is about 35 nm~45 nm; the buried oxide height is about 10 nm~20 nm; and the buffer/glue oxide height is about 10 nm~20 nm.

This written description uses examples to disclose the invention, include the best mode, and also to enable a person skilled in the art to make and use the invention. The patentable scope of the invention may include other examples that occur to those skilled in the art. For example, a semiconductor structure could comprise three or more semiconductor device levels wherein the first semiconductor device level includes a SOI substrate and the second, third or more levels also include a SOI substrate. In another example, a semiconductor structure with multiple semiconductor device levels could include one level containing PMOS devices and another level containing NMOS devices.

One skilled in the relevant art will recognize that the various embodiments may be practiced without one or more of the specific details, or with other replacement and/or additional methods, materials, or components. Well-known structures, materials, or operations may not be shown or described in detail to avoid obscuring aspects of various embodiments of the invention. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the art will recognize various equivalent combinations and substitutions for various components shown in the figures.

What is claimed is:

1. A method of fabricating a multi-semiconductor device layer structure, the method comprising:
    providing a first wafer comprising first channel material bonded to a first buried oxide layer;
    fabricating a first semiconductor device layer from the first channel material, the first semiconductor device layer comprising a patterned top surface and a fin structure protruding from the first buried oxide layer;
    fabricating a single blanket layer comprising insulator material over the patterned surface and in contact with the first buried oxide layer, wherein the single blanket layer is one layer of a single, uniform material composition;
    providing a second wafer comprising second channel material bonded to a second buried oxide layer;
    bonding the second buried oxide layer to the single blanket layer;
    fabricating a second semiconductor device layer from the second channel material after bonding the second buried oxide layer to the single blanket layer; and
    interconnecting a feature of the first semiconductor device layer with a feature of the second semiconductor device layer.

2. The method of claim 1, wherein the first channel material and the second channel material are different.

3. The method of claim 1, wherein providing a first wafer comprises providing a first semiconductor on insulator wafer.

4. The method of claim 1, wherein providing a second wafer comprises providing a second semiconductor on insulator wafer.

5. The method of claim 1, wherein one type of device is exclusively fabricated on one of the first semiconductor device layer and the second semiconductor device layer and another type of device is exclusively fabricated on the other of the first semiconductor device layer and the second semiconductor device layer.

6. The method of claim 5, wherein the one type of device comprises a PMOS device and the other type of device comprises a NMOS device.

7. The method of claim 1, wherein the single blanket layer is fabricated with a thickness that is limited by a depth of a deepest contact hole and wherein an aspect ratio comprising the depth of the deepest contact hole relative to an opening of the deepest contact hole is less than 10.

8. The method of claim 1, wherein the insulator material of the single blanket layer is oxide-based material, and further wherein the single blanket layer provides a substantially homogeneous bonding interface for the buried oxide layer of the second wafer.

9. The method of claim 1, wherein the thickness of the single blanket layer is about 10 nm to about 20 nm.

10. The method of claim 1, wherein the single blanket layer is unpatterned at the time of formation.

11. A method of fabricating a multi-semiconductor device layer structure, the method comprising:
    providing a first semiconductor on insulator wafer comprising first channel material bonded to a first buried oxide layer;
    fabricating a first semiconductor device layer from the first channel material, the first semiconductor device layer comprising a patterned top surface and a fin structure protruding from the first buried oxide layer;
    fabricating a single blanket layer comprising insulator material over the patterned surface and in contact with the first buried oxide layer, wherein the single blanket layer is one layer of a single, uniform material composition;
    bonding a second wafer comprising second channel material and a second buried oxide layer to the single blanket layer such that the second buried oxide layer is in contact with the single blanket layer; and
    fabricating a second semiconductor device layer from the second channel material.

12. The method of claim 11, wherein the first channel material and the second channel material are different.

13. The method of claim 11, wherein one type of device is exclusively fabricated on one of the first semiconductor device layer and the second semiconductor device layer and another type of device is exclusively fabricated on the other of the first semiconductor device layer and the second semiconductor device layer.

14. The method of claim 13, wherein the one type of device comprises a PMOS device and the other type of device comprises a NMOS device.

15. The method of claim 11, wherein bonding a second wafer further comprises depositing oxide material onto the second channel material.

16. The method of claim 11, wherein bonding a second wafer further comprises planarizing the second channel material.

17. The method of claim 11, further comprising interconnecting a feature of the first semiconductor device layer with a feature of the second semiconductor device layer.

18. The method of claim 11, wherein the single blanket layer is fabricated with a thickness that is limited by a depth of a deepest contact hole and wherein an aspect ratio comprising the depth of the deepest contact hole relative to an opening of the deepest contact hole is less than 10.

19. The method of claim 11, wherein the insulator material of the single blanket layer is oxide-based material, and further wherein the single blanket layer provides a substantially homogeneous bonding interface for the second buried oxide layer of the second wafer.

20. The method of claim 11, wherein the thickness of the single blanket layer is about 10 nm to about 20 nm.

21. The method of claim 11, wherein the single blanket layer is unpatterned at the time of formation.

* * * * *